(12) United States Patent
Lisart et al.

(10) Patent No.: US 10,497,653 B2
(45) Date of Patent: Dec. 3, 2019

(54) DECOUPLING CAPACITOR

(71) Applicants: STMicroelectronics (Crolles 2) SAS, Crolles (FR); STMicroelectronics (Rousset) SAS, Rousset (FR)

(72) Inventors: Mathieu Lisart, Aix en Provence (FR); Benoit Froment, Grenoble (FR)

(73) Assignees: STMICROELECTRONICS (CROLLES 2) SAS, Crolles (FR); STMICROELECTRONICS (ROUSSET) SAS, Rousset (FR)

( * ) Notice: Subject to any disclaimer, the term of this patent is extended or adjusted under 35 U.S.C. 154(b) by 198 days.

(21) Appl. No.: 15/788,611

(22) Filed: Oct. 19, 2017

(65) Prior Publication Data

US 2018/0233460 A1    Aug. 16, 2018

(30) Foreign Application Priority Data

Feb. 13, 2017   (FR) ..................................... 17 51154

(51) Int. Cl.

| H01L 23/00 | (2006.01) |
|---|---|
| H01L 23/522 | (2006.01) |
| H01L 23/528 | (2006.01) |
| G01R 31/02 | (2006.01) |
| H01L 23/64 | (2006.01) |
| H01L 25/16 | (2006.01) |

(52) U.S. Cl.
CPC .......... *H01L 23/573* (2013.01); *G01R 31/028* (2013.01); *H01L 23/5223* (2013.01); *H01L 23/5286* (2013.01); *H01L 23/576* (2013.01); *H01L 23/642* (2013.01); *H01L 25/16* (2013.01)

(58) Field of Classification Search
CPC ...... G01R 31/00; G01R 31/02; G01R 31/028; H01L 23/00; H01L 23/52; H01L 23/522; H01L 23/5222; H01L 23/5223; H01L 23/528; H01L 23/5286; H01L 23/57; H01L 23/573; H01L 23/576; H01L 23/58; H01L 23/64; H01L 23/642; H01L 25/00; H01L 25/16
USPC ............. 324/500, 537, 548; 361/271, 301.1, 361/306.1, 306.2, 306.3, 307, 308.1, 310, 361/734, 763, 821, 301.02
See application file for complete search history.

(56) References Cited

U.S. PATENT DOCUMENTS

| 5,585,651 | A | 12/1996 | Kitagawa et al. |
|---|---|---|---|
| 6,323,518 | B1 | 11/2001 | Sakamoto et al. |
| 8,809,858 | B2 | 8/2014 | Lisart et al. |
| 10,157,910 | B2 * | 12/2018 | Xu ...................... H01L 27/0629 |
| 2002/0085336 | A1 * | 7/2002 | Winer ................... H01L 21/563 361/306.3 |
| 2004/0197989 | A1 * | 10/2004 | Sommer ........... H01L 27/10841 438/243 |
| 2007/0134852 | A1 | 6/2007 | Byun et al. |
| 2009/0242953 | A1 * | 10/2009 | Booth, Jr. ........... H01L 27/0629 257/301 |
| 2011/0148466 | A1 * | 6/2011 | Aton .................. H01L 27/0207 326/103 |

(Continued)

*Primary Examiner* — Hoai-an D. Nguyen
(74) *Attorney, Agent, or Firm* — Seed Intellectual Property Law Group LLP

(57) ABSTRACT

A decoupling capacitor includes: two capacitor cells sharing the same well; a first trench isolation passing through the well between the two cells without reaching the bottom of the well; and a contact with the well formed in each cell.

19 Claims, 5 Drawing Sheets

(56) References Cited

U.S. PATENT DOCUMENTS

| | | | |
|---|---|---|---|
| 2012/0049260 A1* | 3/2012 | Kim | H01L 27/0808 257/300 |
| 2012/0320477 A1 | 12/2012 | Lisart et al. | |
| 2014/0117497 A1* | 5/2014 | Pereira | H01L 27/0207 257/532 |
| 2015/0014687 A1 | 1/2015 | Nakajima | |
| 2015/0194393 A1 | 7/2015 | Lisart et al. | |
| 2016/0218071 A1 | 7/2016 | Nam et al. | |
| 2017/0092600 A1 | 3/2017 | Lisart et al. | |
| 2017/0116439 A1 | 4/2017 | Sarafianos et al. | |
| 2017/0301635 A1 | 10/2017 | Sarafianos et al. | |

\* cited by examiner

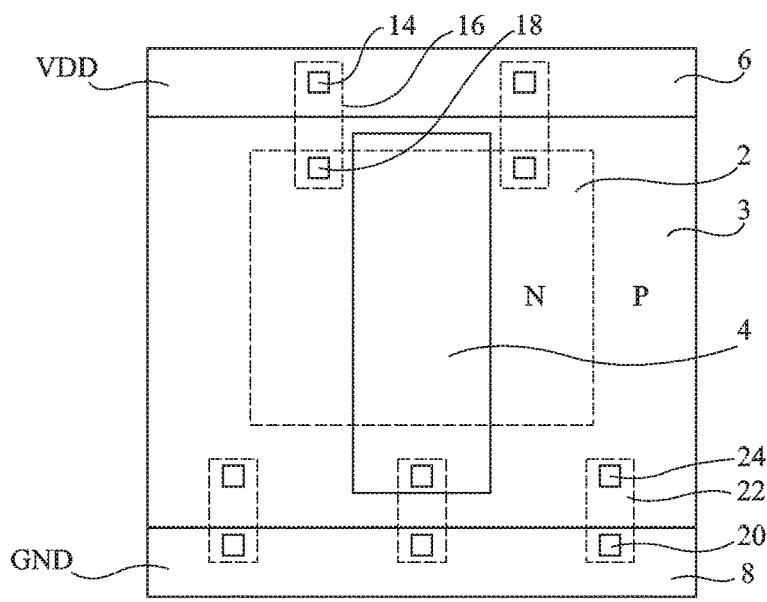
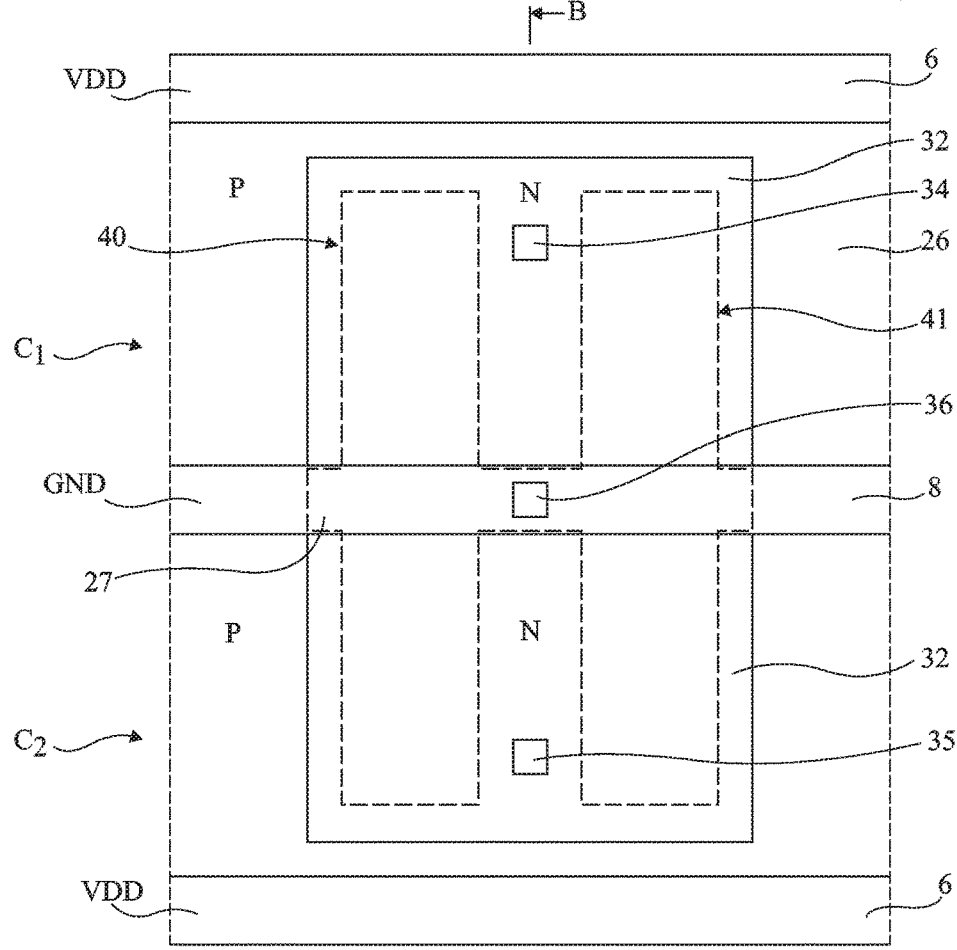

DECOUPLING CAPACITOR

BACKGROUND

Technical Field

The present application relates to integrated electronic circuits, and more particularly to an integrated circuit equipped with a back-side device protecting the circuit.

Description of the Related Art

Integrated circuits are sometimes subjected to attacks the aim of which is to determine the structure of the circuit, to modify the operation thereof or to extract confidential information therefrom. An attack may be carried out from the back side of a circuit equipped on its front side with components such as capacitors, diodes or transistors, coated with conductive tracks. During the attack, a section of the back side is first etched, approximately down to level with the wells in which the components are formed. A smaller aperture, for example of 2 µm×2 µm size, is formed in this section of the back side, approximately down to level with active zones and shallow trench isolations (STIs). In this aperture, cavities are produced, for example by ion beam, these cavities extending down to level with the components or conductive tracks on the front face. Electrical contacts with the components or tracks are then created in these cavities, and the pirates use these contacts to analyze the circuit in operation.

An integrated circuit liable to undergo such an attack may comprise several hundred decoupling capacitors. These decoupling capacitors serve to limit the influence of voltage fluctuations on the circuit. The decoupling capacitors may occupy more than 20% of the real estate of the integrated circuit and are, just like the other elements of the integrated circuit, arranged in cells. These cells are formed between a conductive line at a potential VDD and a conductive line at ground potential. These lines are generally common to many cells.

FIG. 1 schematically shows from above an example of a capacitor cell forming a decoupling capacitor. The cell comprises a well 2 doped n-type, depicted by the dashed line, in a substrate 3 that is doped p-type. A conductive line 4, for example made of polysilicon, is formed on the well 2, with interposition of a dielectric layer (not shown). This conductive line 4 corresponds to a gate line of a MOS transistor and a p-implant is formed in the well 2 using this line 4 by way of mask.

The cell is placed between conductive supply lines, for example a line 6 at a positive voltage VDD and a line 8 at ground potential (GND). Contacts 14 are formed on the line 6 and are connected, by conductive tracks 16, which have been depicted by dashed lines, to contacts 18 with the zone implanted in the well 2. Likewise, contacts 20 are formed on the line 8 and are connected, by conductive tracks 22, which have been depicted by dashed lines, to contacts 24 formed on the line 4 and on the substrate 3, connecting them both to ground.

A capacitor is therefore formed between the portion of the well 2 located under the conductive line 4 and this conductive line 4.

It is easy to dig holes through these decoupling capacitors without disrupting the operation of the circuit. Specifically, the cells containing the decoupling capacitors comprise few key elements and enough space for the passage of contacts. The sites in which the decoupling capacitors are located therefore run the risk of most particularly being targeted by pirates.

It would be desirable to protect decoupling capacitors from attacks of the type described above.

BRIEF SUMMARY

Thus, one embodiment provides a decoupling capacitor comprising: two capacitor cells sharing the same well; a first trench isolation passing through the well between the two cells without reaching the bottom of the well; and a contact with the well formed in each cell.

According to one embodiment, the cells are placed between two conductive supply strips, on either side of a central supply strip.

According to one embodiment, the capacitor is formed by the first trench isolation and by second trench isolations extending in the well in a direction orthogonal to that of the first trench isolation.

According to one embodiment, capacitors comprising a trench isolation are formed in the substrate in which the well is formed.

One embodiment provides an integrated circuit containing a decoupling capacitor such as described above and a circuit for detecting the impedance between the contacts with the well in each cell.

BRIEF DESCRIPTION OF THE SEVERAL VIEWS OF THE DRAWINGS

These features and advantages, and others, will be described in detail in the following description of particular embodiments, which description is nonlimiting and given with reference to the appended figures, in which:

FIG. 1, which was described above, schematically shows a capacitor;

FIGS. 2A and 2B are a top view and a cross-sectional view illustrating one embodiment of two capacitor cells protected from back-side attacks;

DETAILED DESCRIPTION

Elements that are the same have been referenced by the same references in the various figures and, in addition, the various figures have not been drawn to scale. For the sake of clarity, only those elements that are useful to the comprehension of the described embodiments have been shown and are detailed.

In the following description, when reference is made to qualifiers of position, such as the terms "front," "back," "under." "horizontal," "vertical," etc., reference is being made to the position of the elements in question in the figures. Unless otherwise specified, the expression "approximately" must be interpreted as meaning to within 10% and preferably to within 5%.

Figure 2B:
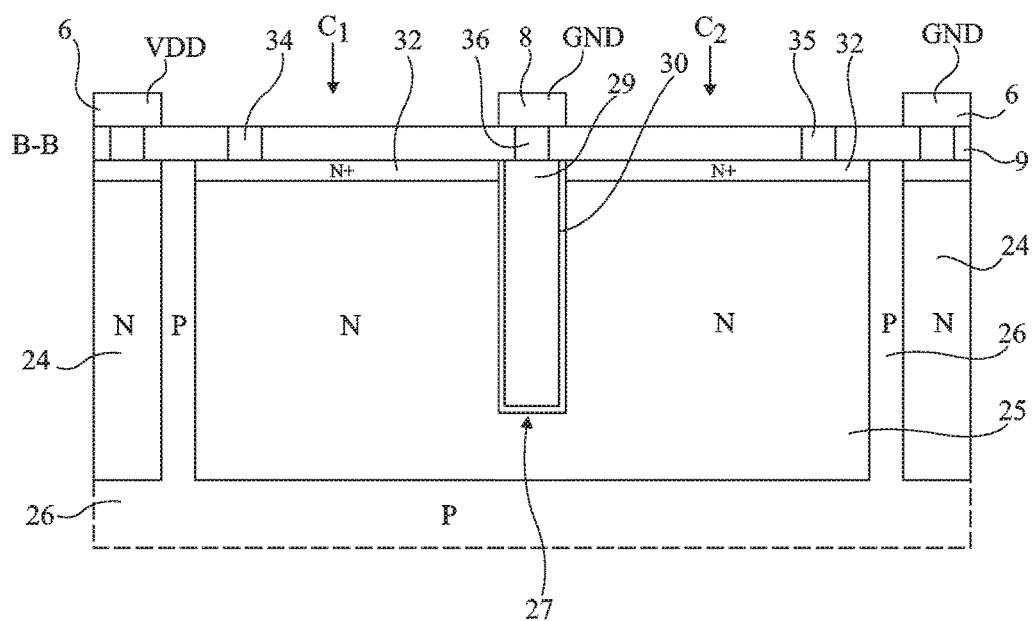

FIGS. 2A and 2B are a top view and a cross-sectional view along the line B-B of FIG. 2A, showing one embodiment of two capacitor cells, these capacitors being protected from back-side attacks. The capacitors are here, by way of example, capacitors based on trench isolations.

As was described above, each cell is placed between a conductive line at a potential VDD and a conductive line at ground potential (GND). The two cells C1, C2 shown are formed between two conductive lines 6 at the potential VDD on either side of a conductive line 8 at ground potential, the latter line being common to the two cells. The conductive lines 6 and 8 are for example metal lines that are separated from subjacent layers by an insulator 9, shown in FIG. 2B, and connected to chosen regions by conductive vias and optionally conductive tracks (not shown).

The two cells C1, C2 share the same well 25, which is doped n-type and formed in a substrate 26 that is doped p-type. A trench 27 is formed between the two cells, in the well 25. The trench 27 extends, under the conductive line 8, at least the entire width of the well 25, but to a depth that is smaller than the depth of the well 25, as may be seen in FIG. 2B. The portion of the well 25 of the cell C1 and the portion of the well 25 of the cell C2 are connected by a section of the well 25, this section being located under the trench 27. The trench 27 has a conductive core, for example made of polysilicon 29, separated from the well 25 by a dielectric cladding 30, for example made of silicon oxide.

The n-doped well 25 is covered with a highly n-doped layer 32. A contact 34, 35 is formed on each of the two portions of the layer 32, i.e., the two portions separated by the trench 27. A contact 36 connects the core 29 of the trench 27 to the conductive line 8, which is at the reference potential GND.

Figure 5:
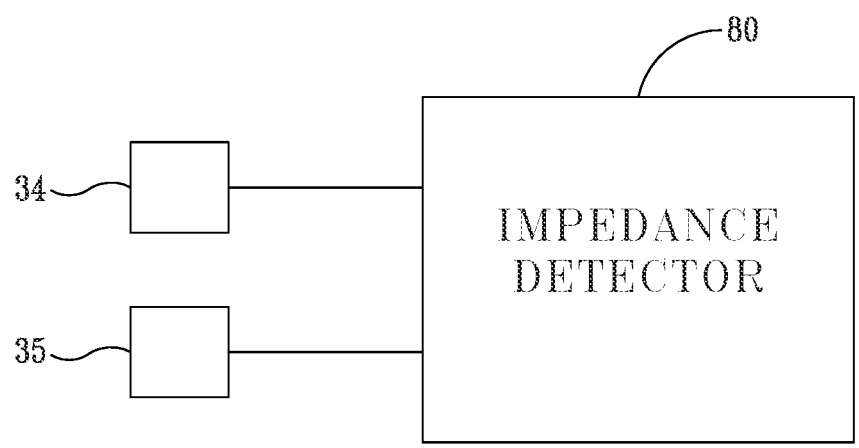
FIG. 5 is a schematic of an integrated circuit according to one embodiment.

Provision is made here, intermittently, for example periodically, for the contacts 34 and 35 to be used to check the continuity of the well 25 between the two cells, for example by measuring the impedance between the two contacts, which is compared to a reference value. To do this, the contacts 34 and 35 are connected to a circuit 80 (FIG. 5) capable, intermittently, of taking a measurement, for example a measurement of a current flowing through the well 25 between the contacts 34 and 35, which thereby provides an indirect measurement of the impedance between the two contacts.

During a back-side attack such as described above, targeting such cells, the pirate etches, from the back side, into the well 25. The bottom of the trench 27 is approached and for example reached. This will cause a variation in the impedance between the nodes corresponding to the contacts 34 and 35, which will be able to be measured during a subsequent measurement. The measurements of the impedance between the contacts 34 and 35 are sufficiently close together to allow rapid detection of a back-side attack.

In the cells C1 and C2, which are protected from attacks as was indicated above, entirely conventional capacitors will possibly be formed. However, given that the cell already comprises a trench isolation 27, it is desirable, to minimize the number of fabricating steps, to form these capacitors in trench isolations 40 and 41 of the same type as the separating trench 27 between the cells. Thus, as may be seen in the top view of FIG. 2A, these trenches 40 and 41 cross the trench 27 and their internal conductive cores are common. The core of the trench 27 is therefore also a capacitor element.

In normal operation, the p-substrate 26 will be biased to a potential GND, the n-well 25 to a potential VDD and the conductor of the core 29 of the trenches 27, 40 and 41 to a potential GND. As is shown, the trenches 40 and 41 extend the length of the two cells and are preferably identical to the trench 27.

It will again be noted that, whereas, in normal operation, the well 25 common to the two cells C1 and C2 is at a single potential, VDD, during phases of detecting whether an attack is being carried out, the two well portions are for example placed at different potentials in order to detect the impedance between the contacts 34 and 35.

Above, in a general and simplified way, a pair of adjacent cells containing capacitors arranged so as to detect an attack was described. It will be shown below that not only, as was described above, is this arrangement effective, but furthermore a practical structure allowing this arrangement to be used is particularly simple to produce.

Figure 3:
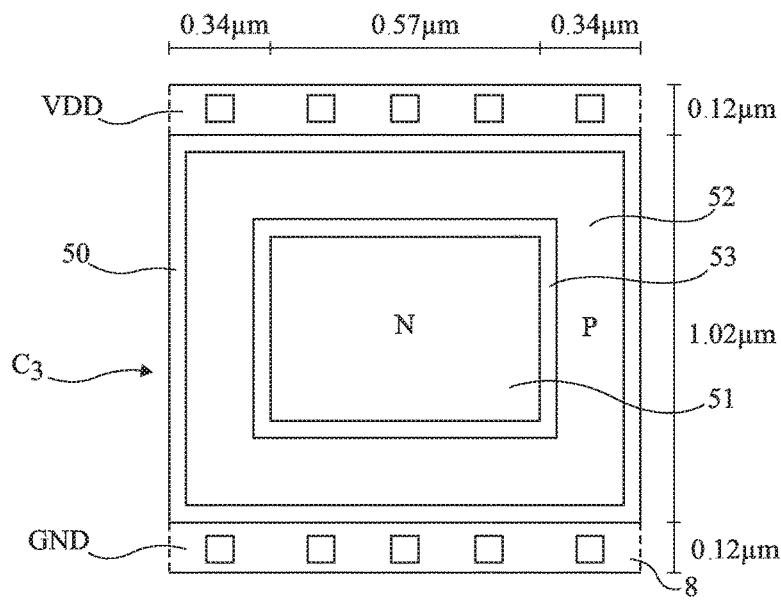
FIG. 3 is a top view of an integrated-circuit cell.

FIG. 3 shows an example, with dimensions labelled, of an integrated-circuit cell produced in a particular technology. The cell, C3, is formed between two conductive lines 6 and 8 having widths of 0.12 µm, which are at VDD and GND, respectively. The cell is encircled by a shallow trench isolation 50 (commonly called an STI in the art). The cell contains an n-well 51 formed in a p-substrate 52. The n-well 51 is encircled by an STI insulating wall 53. In the example considered here, the distance between the two conductive lines is 1.02 µm. The lateral dimension of the n-well 51, in the direction parallel to the conductive lines 6 and 8, is 0.57 µm and the distance, in the same direction, between the well 51 and the sides of the cell C3 is 0.34 µm.

Figure 4A:
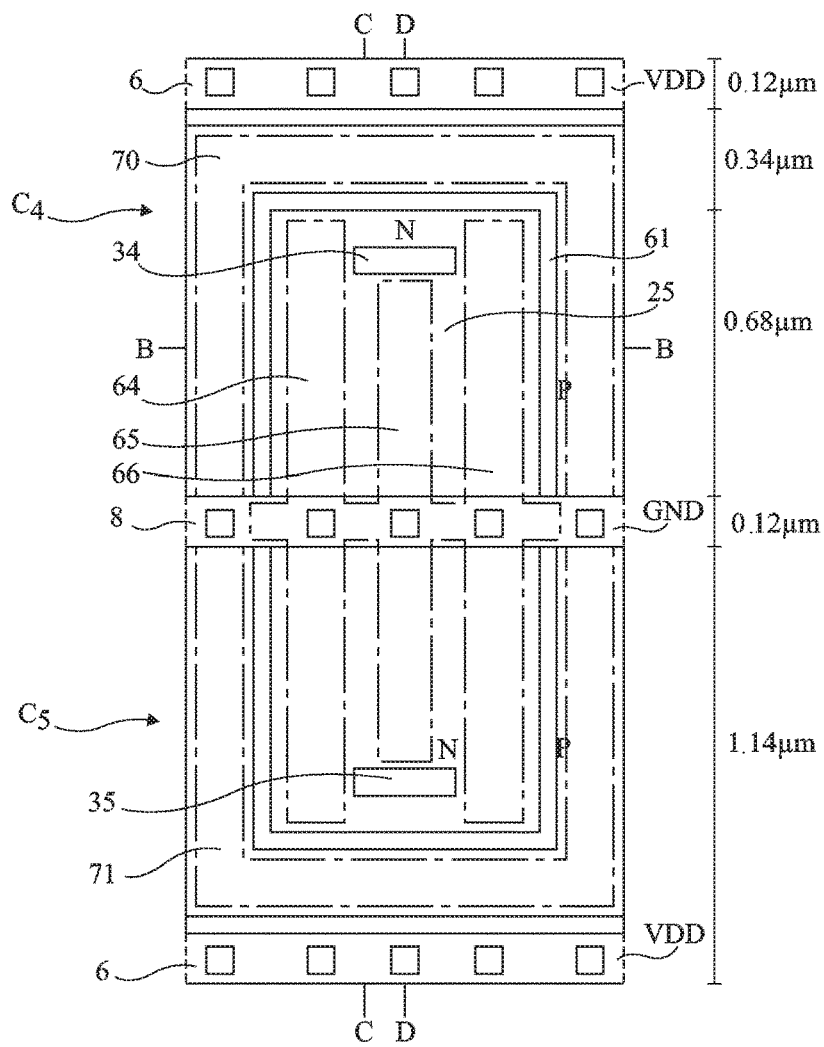
FIG. 4A is a more detailed top view of one embodiment of two capacitor cells protected from back-side attacks.
Figure 4B:
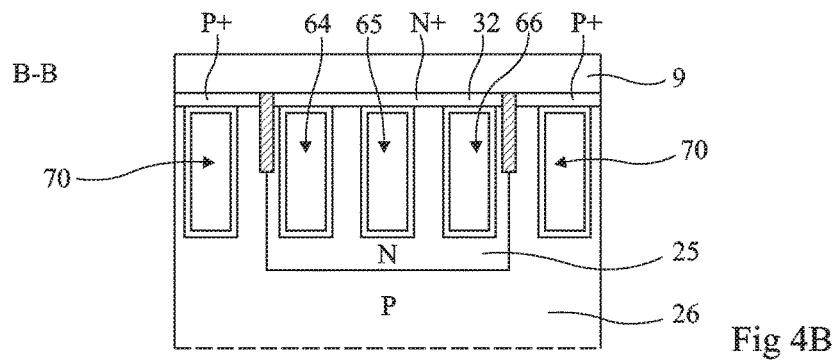
FIGS. 4B to 4D are various cross-sectional views of the cells of FIG. 4A.
Figure 4C:
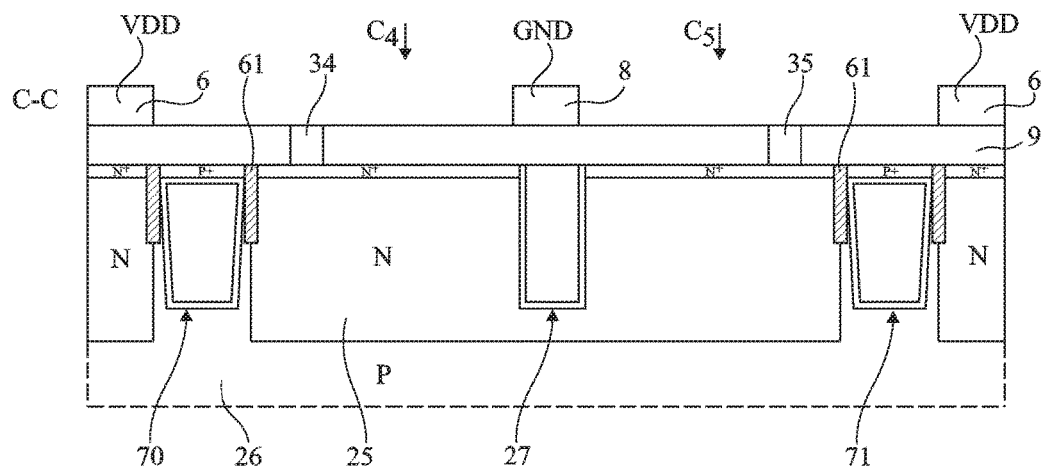
Figure 4D:
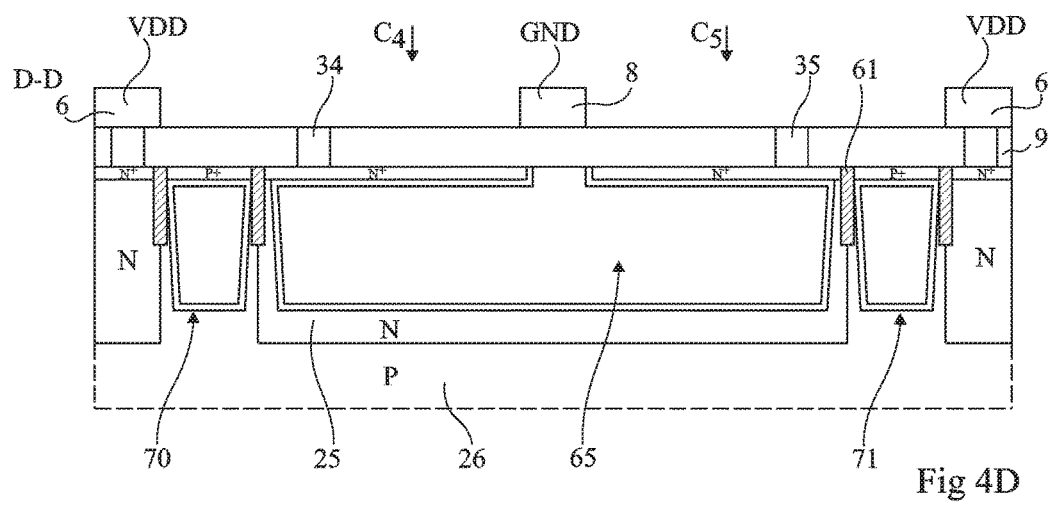

FIGS. 4A to 4D show one example embodiment of two capacitor cells protected from back-side attacks and having a high total capacitance with regard to the available cell real estate and existing fabrication technologies. FIG. 4A is a top view, with dimensions labelled, and FIGS. 4B to 4D are cross-sectional views along the lines B-B, C-C and D-D of FIG. 4A.

As FIGS. 4A to 4D illustrate, in one embodiment two adjacent cells C4 and C5 are used, the cells being located on either side of a conductive line 8 at the reference voltage GND and between conductive lines 6 at the reference voltage VDD. The horizontal dimensions of the structure are those illustrated in FIG. 3. An n-well 25, which is encircled by an STI trench isolation 61, extends in both the two cells in the way shown. The upper limit of the well 25 is located 0.34 µm from the closest conductive line 6, and its lower limit is located at the same distance from the other conductive line 6. The well 25 is formed in a p-type substrate 26. As was described with reference to FIGS. 2A and 2B, a trench isolation 27 extends in the n-well 25 under the conductive line 8 at GND. In this structure, it is possible to place, vertically in the interior of the n-well 25, three trench isolations 64, 65 and 66 having widths of about 0.16 µm, this being perfectly compatible with the design rules of the technology considered here. One of the trenches 64, 65 and 66 has a length smaller than that of the other trenches, so as to allow measurement contacts 34 and 35 to be formed on a highly n-doped layer 32 formed on the well 25, such as was described with reference to FIGS. 2A and 2B. Likewise, on the periphery of the n-well 25, it is possible to place, in the p-substrate 26, trenches connected to a conductive line 6, said trenches being insulated from the p-doped substrate 26 and the highly p-doped layer, and discontinuous between the upper portion thereof, 70 on the upper side, and the lower portion thereof, 71 on the lower side. Once again, the production of trenches of the width of about 0.16 µm is perfectly compatible with the design rules of the technology considered here.

FIGS. 4B, 4C and 4D, which are respectively cross-sectional views along the lines B-B, C-C and D-D of FIG. 4A, allow the production of the structure to be better understood. These figures will not be described in detail because they are self-explanatory. The various elements of these figures have been referenced by the same references as in FIG. 4A and, where appropriate, as in FIGS. 2A and 2B. The presence of measurement contacts 34 and 35 will in particular be noted. The hatched regions correspond to STI insulating walls.

The objective of the description of FIG. 4A and the presence of FIGS. 4B, 4C and 4D is to show that the structure described here is particularly simple to produce in one practical case. Of course, depending on the technology and the design rules in question, various other embodiments could be used. In any case, practical production will be simple.

In the particular case shown in FIGS. 4A to 4D, not only is a capacitor having a capacitance of 10 pF obtained for a pair of cells, this being a particularly high value for the small amount of silicon real estate used, but also decoupling-capacitor cells that are protected from a back-side attack.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A decoupling capacitor comprising:
   first and second capacitor cells sharing a well with each other;
   a first trench isolation passing through the well between the two cells without reaching a bottom of the well; and
   first and second conductive contacts respectively connected to the first and second capacitor cells.

2. The decoupling capacitor according to claim 1, further comprising conductive first and second lateral supply strips and a conductive central supply strip, wherein the first capacitor cell is positioned between the first lateral supply strip and the central supply strip and the second capacitor cell is positioned between the second lateral supply strip and the central supply strip.

3. The decoupling capacitor according to claim 2, wherein the first trench isolation includes a conductive core and a dielectric cladding that surrounds the conductive core and insulates the conductive core from the well, the central supply strip being electrically coupled to the conductive core.

4. The decoupling capacitor according to claim 1, further comprising second trench isolations extending longitudinally in the well in a direction orthogonal to a longitudinal extension of the first trench isolation.

5. The decoupling capacitor according to claim 1, further comprising:
   a substrate in which the well is formed;
   a third capacitor cell including a second trench isolation formed in the substrate and outside of the well; and
   a fourth capacitor cell including a third trench isolation formed in the substrate and outside of the well.

6. The decoupling capacitor according to claim 5, wherein the second trench isolation encircles three sides of a first half of the well and the third trench isolation encircles three sides of a second half of the well.

7. The decoupling capacitor according to claim 5, wherein each of the second and third trench isolations includes a conductive core and a dielectric cladding that surrounds the conductive core and insulates the conductive core from the substrate.

8. The decoupling capacitor according to claim 5, further comprising a shallow trench insulation that completely encircles the well and separates the second and third trench isolations from the well.

9. An integrated circuit comprising:
   a decoupling capacitor that includes:
      first and second capacitor cells sharing a well with each other;
      a first trench isolation passing through the well between the two cells without reaching a bottom of the well; and
      first and second conductive contacts respectively connected to the first and second capacitor cells; and
   a detection circuit configured to detect an impedance between the first and second contacts.

10. The integrated circuit according to claim 9, wherein the decoupling capacitor includes conductive first and second lateral supply strips and a conductive central supply strip, wherein the first capacitor cell is positioned between the first lateral supply strip and the central supply strip and the second capacitor cell is positioned between the second lateral supply strip and the central supply strip.

11. The integrated circuit according to claim 10, wherein the first trench isolation includes a conductive core and a dielectric cladding that surrounds the conductive core and insulates the conductive core from the well, the central supply strip being electrically coupled to the conductive core.

12. The integrated circuit according to claim 9, wherein the decoupling capacitor includes second trench isolations extending longitudinally in the well in a direction orthogonal to a longitudinal extension of the first trench isolation.

13. The integrated circuit according to claim 9, wherein the decoupling capacitor includes:
   a substrate in which the well is formed;
   a third capacitor cell including a second trench isolation formed in the substrate and outside of the well; and
   a fourth capacitor cell including a third trench isolation formed in the substrate and outside of the well.

14. The integrated circuit according to claim 13, wherein the second trench isolation encircles three sides of a first half of the well and the third trench isolation encircles three sides of a second half of the well.

15. The integrated circuit according to claim 13, wherein each of the second and third trench isolations includes a conductive core and a dielectric cladding that surrounds the conductive core and insulates the conductive core from the substrate.

16. The integrated circuit according to claim 13, further comprising a shallow trench insulation that completely encircles the well and separates the second and third trench isolations from the well.

17. A method of using a decoupling capacitor that includes first and second capacitor cells sharing a well with each other; a first trench isolation passing through the well between the two cells without reaching a bottom of the well; and first and second conductive contacts respectively connected to the first and second capacitor cells, the method comprising:
   setting the first and second conductive contacts to first and second voltages, respectively, the first and second voltages being different from each other; and measuring an impedance across the well while the first and second conductive contacts are set at the first and second voltages, respectively.

18. The method according to claim 17, wherein the decoupling capacitor includes conductive first and second lateral supply strips and a conductive central supply strip, wherein the first capacitor cell is positioned between the first lateral supply strip and the central supply strip and the second capacitor cell is positioned between the second lateral supply strip and the central supply strip, the method including providing a first supply voltage to the first and second lateral supply strips and a second supply voltage to the central supply strip.

19. The method according to claim 18, wherein the first trench isolation includes a conductive core and a dielectric cladding that surrounds the conductive core and insulates the conductive core from the well, the central supply strip being electrically coupled to the conductive core, wherein applying the second supply voltage to the central supply strip also supplies the second supply voltage to the conductive core.

* * * * *